United States Patent
Kim et al.

(10) Patent No.: US 10,559,335 B2
(45) Date of Patent: Feb. 11, 2020

(54) METHOD OF TRAINING DRIVE STRENGTH, ODT OF MEMORY DEVICE, COMPUTING SYSTEM PERFORMING THE SAME AND SYSTEM-ON-CHIP PERFORMING THE SAME

(71) Applicant: SAMSUNG ELECTRONICS CO., LTD., Suwon-si (KR)

(72) Inventors: Yong-Seob Kim, Hwaseong-si (KR); Jung-Il Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/116,369

(22) Filed: Aug. 29, 2018

(65) Prior Publication Data

US 2019/0172510 A1    Jun. 6, 2019

(30) Foreign Application Priority Data

Dec. 5, 2017    (KR) .......................... 10-2017-0166251

(51) Int. Cl.
| | | |
|---|---|---|
| *G11C 7/20* | (2006.01) | |
| *G11C 7/22* | (2006.01) | |
| *G11C 5/14* | (2006.01) | |
| *H03K 19/0175* | (2006.01) | |
| *G11C 7/10* | (2006.01) | |

(52) U.S. Cl.
CPC .............. *G11C 7/222* (2013.01); *G11C 5/147* (2013.01); *G11C 7/20* (2013.01); *G11C 7/1045* (2013.01); *G11C 2207/2254* (2013.01); *H03K 19/017545* (2013.01)

(58) Field of Classification Search
CPC .......... G11C 7/222; G11C 5/147; G11C 7/20; G11C 7/1045; G11C 2207/2254; G11C 7/1084; G11C 7/1066; G11C 7/1057; G11C 7/1093; G11C 29/08
See application file for complete search history.

(56) References Cited

U.S. PATENT DOCUMENTS

| | | |
|---|---|---|
| 7,068,084 B2 | 6/2006 | Byun et al. |
| 7,786,752 B2 | 8/2010 | Oh et al. |
| 8,312,258 B2 | 11/2012 | Xing et al. |
| 8,582,374 B2 | 11/2013 | Mozak et al. |
| 9,171,585 B2 | 10/2015 | Rajan et al. |
| 9,343,165 B2 | 5/2016 | Vaysman et al. |

(Continued)

FOREIGN PATENT DOCUMENTS

KR    10-1407835 B1    6/2014

*Primary Examiner* — Khamdan N. Alrobaie
(74) *Attorney, Agent, or Firm* — Sughrue Mion, PLLC

(57) ABSTRACT

In a method of training for a memory device, an initialization operation is performed on the memory device when the memory device is powered on. A training operation is performed on a plurality of operating frequencies of the memory device such that at least one of a plurality of operating parameters of the memory device is obtained as a configurable operating parameter for each of the plurality of operating frequencies. The configurable operating parameter for each of the plurality of operating frequencies is stored as training data. An optimized operating parameter for the memory device is used based on the training data, a current operation mode of the memory device, and a current operating frequency of the memory device.

20 Claims, 14 Drawing Sheets

(56) References Cited

U.S. PATENT DOCUMENTS

| | | | |
|---|---|---|---|
| 9,607,714 B2 | 3/2017 | Malladi et al. | |
| 2003/0063506 A1* | 4/2003 | Brox | G11C 7/1072 365/200 |
| 2006/0053273 A1* | 3/2006 | Chu | G06F 9/4403 713/1 |
| 2008/0235444 A1* | 9/2008 | Gower | G11C 5/04 711/105 |
| 2011/0050294 A1* | 3/2011 | Park | G06F 1/08 327/115 |
| 2012/0042116 A1* | 2/2012 | Park | G06F 13/4086 711/102 |
| 2015/0286593 A1* | 10/2015 | Gans | G11C 7/1045 710/313 |
| 2016/0041943 A1* | 2/2016 | Hollis | G06F 13/4243 710/106 |
| 2016/0314822 A1 | 10/2016 | Yeung et al. | |
| 2017/0093400 A1 | 3/2017 | Bains et al. | |
| 2019/0189226 A1* | 6/2019 | Srivastava | G11C 7/22 |

\* cited by examiner

FIG. 6

| OPERATING FREQUENCY | CONFIGURABLE DRIVE STRENGTH |
|---|---|
| F1 | DS2, DS3, DS4 |
| F2 | DS3, DS4 |
| ... | ... |

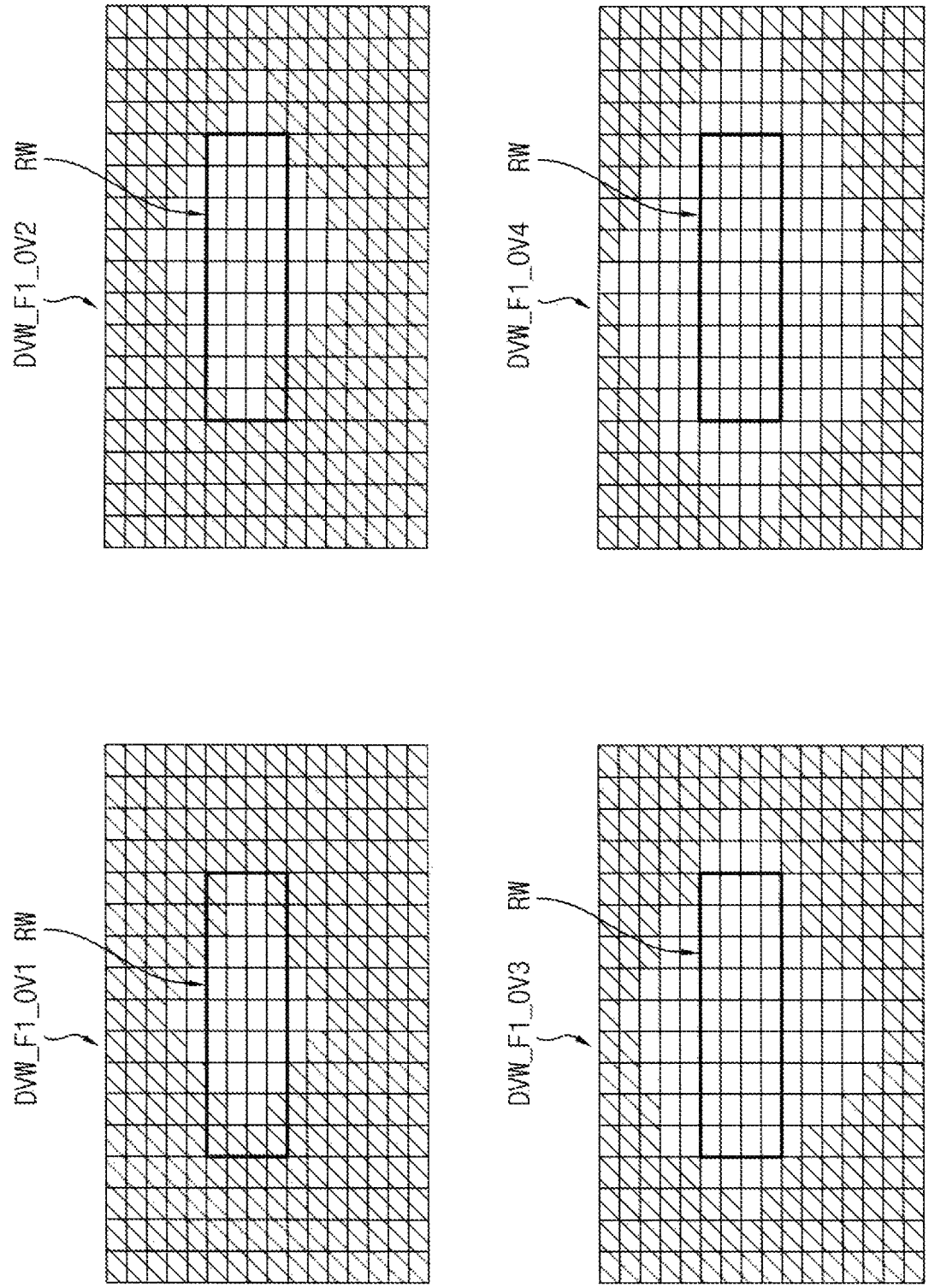

FIG. 9

| OPERATING FREQUENCY | CONFIGURABLE ODT RESISTANCE VALUE |
|---|---|
| F1 | OV3, OV4 |
| F2 | OV2, OV3, OV4 |
| ... | ... |

METHOD OF TRAINING DRIVE STRENGTH, ODT OF MEMORY DEVICE, COMPUTING SYSTEM PERFORMING THE SAME AND SYSTEM-ON-CHIP PERFORMING THE SAME

CROSS-REFERENCE TO RELATED APPLICATION

This application claims priority under 35 USC § 119 from Korean Patent Application No. 10-2017-0166251, filed on Dec. 5, 2017 in the Korean Intellectual Property Office (KIPO), the contents of which are herein incorporated by reference in their entirety.

BACKGROUND

1. Technical Field

Apparatuses and methods consistent with aspects of exemplary embodiments relate generally to semiconductor devices, and more particularly to methods of training for memory devices, computing systems performing the methods, and system-on-chips performing the methods.

2. Description of the Related Art

A system-on-chip (SOC) refers to a processing system that integrates various functional blocks (e.g., a central processing unit, a memory, an interface unit, a digital signal processing unit, an analog signal processing unit, etc.) into a single or a few semiconductor integrated circuits (ICs) to implement an electronic system, such as a computer system, using a limited number of ICs. A system-on-chip may be interoperable with various types of memory devices by different vendors, densities, processes, etc. A system-on-chip may employ a dynamic voltage and frequency scaling (DVFS) scheme that predicts an operating state of a system-on-chip and/or a memory device and dynamically changes an operating frequency and an operating voltage of the system-on-chip and/or the memory device based on the predicted operating state.

SUMMARY

According to an aspect of an exemplary embodiment, there is provided a method of training for a memory device, the method including: performing an initialization operation on the memory device based on the memory device being powered on; performing a training operation on a plurality of operating frequencies of the memory device to obtain, as a configurable operating parameter for each of the plurality of operating frequencies, at least one of a plurality of operating parameters of the memory device; storing, as training data, the obtained configurable operating parameter for each of the plurality of operating frequencies; and using an optimized operating parameter for the memory device based on the training data, a current operation mode of the memory device, and a current operating frequency of the memory device.

According to an aspect of another exemplary embodiment, there is provided a computing system including: a memory device including a plurality of memory cells and configured to operate based on one of a plurality of operating frequencies; and a host configured to: perform an initialization operation on the memory device based on the memory device being powered on, perform a training operation on the plurality of operating frequencies to obtain, as a configurable operating parameter for each of the plurality of operating frequencies, at least one of a plurality of operating parameters of the memory device, store, as training data, the obtained configurable operating parameter for each of the plurality of operating frequencies, and use an optimized operating parameter for the memory device based on the training data, a current operation mode of the memory device, and a current operating frequency of the memory device.

According to an aspect of another exemplary embodiment, there is provided a system-on-chip (SOC) including: one or more integrated circuits (ICs) configured to: perform an initialization operation on an external memory device based on the external memory device being powered on, perform a training operation on a plurality of operating frequencies of the external memory device to obtain, as a configurable operating parameter for each of the plurality of operating frequencies, at least one of a plurality of operating parameters of the external memory device, store, as training data, the configurable operating parameter for each of the plurality of operating frequencies, and use an optimized operating parameter for the external memory device based on the training data, a current operation mode of the external memory device, and a current operating frequency of the external memory device.

BRIEF DESCRIPTION OF THE DRAWINGS

Illustrative, non-limiting exemplary embodiments will be more clearly understood from the following detailed description taken in conjunction with the accompanying drawings in which:

FIG. 6 is a diagram for describing an example of storing configurable operating parameters for each of a plurality of operating frequencies as training data in FIG. 1, according to an exemplary embodiment;

FIGS. 8A and 8B are diagrams for describing the training operation of FIG. 7, according to an exemplary embodiment;

FIG. 9 is a diagram for describing another example of storing configurable operating parameters for each of a plurality of operating frequencies as training data in FIG. 1, according to an exemplary embodiment.

DETAILED DESCRIPTION OF THE EMBODIMENTS

Figure 1:
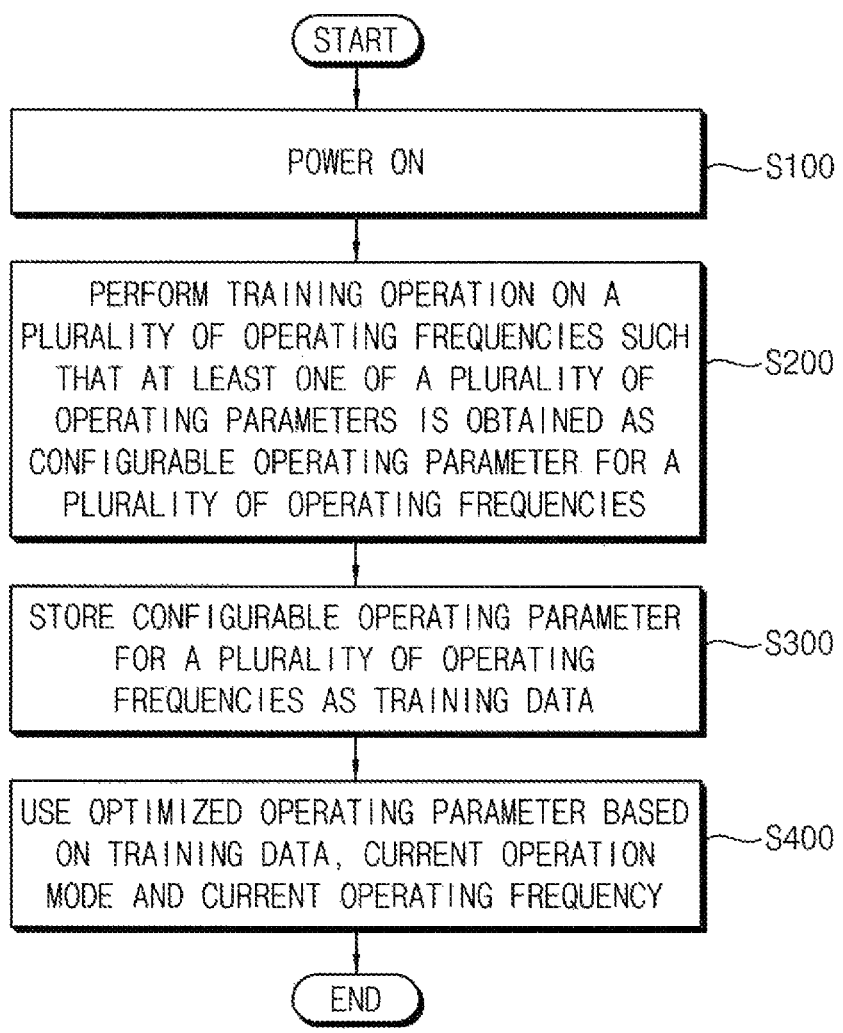
FIG. 1 is a flowchart illustrating a method of training for a memory device according to an exemplary embodiment.

Various exemplary embodiments will be described more fully with reference to the accompanying drawings. The present disclosure may, however, be embodied in many different forms and should not be construed as limited to exemplary embodiments set forth herein. Like reference numerals refer to like elements throughout this application. As used herein, the term "and/or" includes any and all combinations of one or more of the associated listed items. Similarly, expressions such as "at least one of," when preceding a list of elements, modify the entire list of elements and do not modify the individual elements of the list.

FIG. 1 is a flowchart illustrating a method of training for a memory device according to an exemplary embodiment.

Referring to FIG. 1, a method of training for a memory device according to an exemplary embodiment is performed by a host that is connected to the memory device and that controls an operation of the memory device. A detailed configuration of a computing system 10 including the host 50 and the memory device 120 will be described below with reference to FIG. 2.

In the method of training for the memory device according to an exemplary embodiment, an initialization operation is performed on the memory device when the memory device is powered on (operation S100). The initialization operation may be referred to as a booting operation or a series of operations in which the memory device is booted. The booting operation may represent an operation of preparing a normal operation of the memory device by loading instruction codes as well as an operation of providing or applying power to the memory device.

A training operation is performed on the memory device (operation S200). The memory device operates based on one of a plurality of operating frequencies, and the training operation is performed on the plurality of operating frequencies of the memory device. By the training operation, at least one of a plurality of operating parameters of the memory device is obtained as a configurable operating parameter for each of the plurality of operating frequencies. In other words, the operating frequency of the memory device may be changed according to an operating environment of the memory device, and at least one configurable operating parameter may be set for each operating frequency based on the training operation.

The configurable operating parameter for each of the plurality of operating frequencies is stored as training data (operation S300). The training data may be stored in or by the host.

An optimized operating parameter for the memory device is used based on the training data, a current operation mode of the memory device, and a current operating frequency of the memory device (operation S400).

In one or more exemplary embodiments, the memory device may operate based on a dynamic voltage and frequency scaling (DVFS) scheme that dynamically changes an operating frequency and an operating voltage of the memory device, and the training data may be used for employing and/or applying the DVFS scheme to the memory device. For example, when the operating frequency of the memory device is changed according to the DVFS scheme, at least one configurable operating parameter for the current operating frequency may be loaded based on the training data, and one configurable operating parameter may be used as the optimized operating parameter based on the current operation mode.

In the method of training for the memory device according to an exemplary embodiment, optimized operating parameters for different operating frequencies of the memory device may be determined based on the training operation. Accordingly, the memory device may have relatively improved or enhanced operating stability, may prevent unnecessary current consumption, and may have relatively low power consumption.

Figure 2:
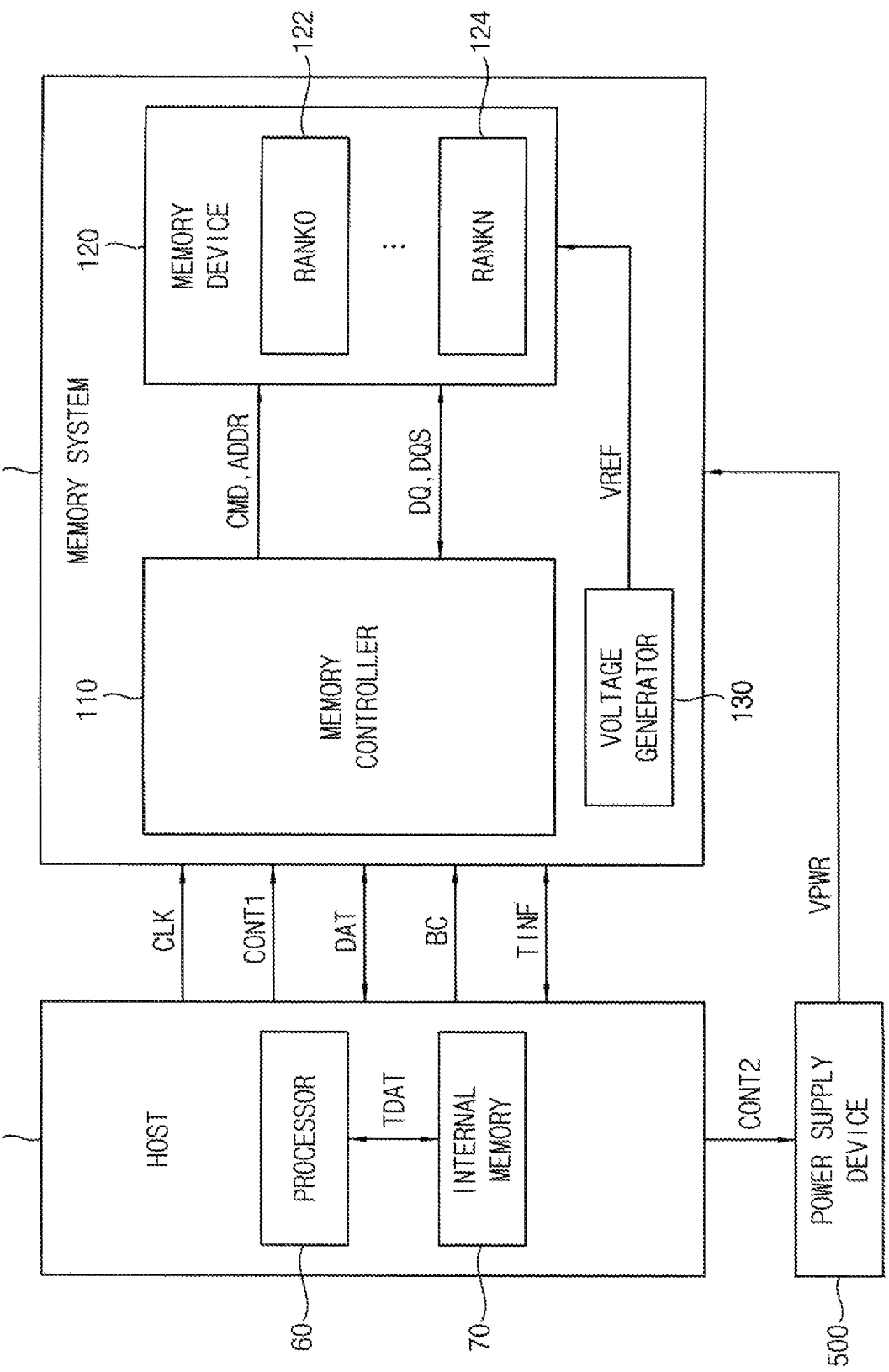
FIG. 2 is a block diagram illustrating a computing system according to an exemplary embodiment.

FIG. 2 is a block diagram illustrating a computing system 10 according to an exemplary embodiment.

Referring to FIG. 2, a computing system 10 includes a host 50 and a memory system 100. The computing system 10 may further include a power supply device 500.

In one or more exemplary embodiments, the computing system 10 may be any electronic system such as a personal computer (PC), a laptop computer, a mobile phone, a smart phone, a tablet computer, a personal digital assistant (PDA), an enterprise digital assistant (EDA), a portable multimedia player (PMP), a digital camera, a music player, a portable game console, a navigation system, a wearable system, an internet of things (IoT) system, a virtual reality (VR) system, an augmented reality (AR) system, a workstation, etc.

The host 50 may control overall operations of the computing system 10. For example, the host 50 may provide a clock signal CLK and a first control signal CONT1 to the memory system 100, may exchange data DAT with the memory system 100, and may provide a second control signal CONT2 to the power supply device 500. The host 50 may include at least one processor 60 and an internal memory 70.

The processor 60 may be driven by executing an operating system (OS). The OS may include a file system for file management and a device driver for controlling peripheral devices at the OS level. In addition, the processor 60 may execute a plurality of applications that provide various services. For example, the processor 60 may execute a video application, a game application, a web browser application, etc. Furthermore, the processor 60 may be any processing unit such as a central processing unit (CPU), a microprocessor, an application processor (AP), or the like.

The internal memory 70 may store codes, instructions, and data that are executed, processed, or handled by the processor 60. For example, the internal memory 70 may be a booting storage device. The internal memory 70 may store booting codes BC that are used for performing an initialization operation and/or a booting operation for a memory device 120, and may store a result of the training operation described above with reference to FIG. 1 as training data TDAT. For example, the internal memory 70 may be a nonvolatile memory device that retains stored data when disconnected from power.

In one or more exemplary embodiments, the host 50 may be a system-on-chip (SOC). In this case, the host 50 may include various functional blocks, e.g., an interface unit (e.g., interface), a digital signal processing unit (e.g., digital signal processor), an analog signal processing unit (e.g., analog signal processor), etc.

The memory system 100 may operate based on the clock signal CLK and the first control signal CONT1, and may exchange the data DAT with the host 50. For example, based on requests from the host 50, the memory system 100 may store (e.g., write) data provided from the host 50, or may retrieve (e.g., read) stored data for the host 50. The memory system 100 may include a memory controller 110, at least one memory device 120, and a voltage generator 130.

The memory controller 110 may control overall operations of the memory system 100. For example, based on requests from the host 50, the memory controller 110 may control data read/write operations of the memory device 120. The memory controller 110 may provide a command CMD and an address ADDR to the memory device 120, and may exchange a data signal DQ and a data strobe signal DQS with the memory device 120. The data strobe signal DQS may be generated based on the clock signal CLK. The memory controller 110 may be disposed or located inside the host 50.

The voltage generator 130 may generate a reference voltage VREF based on a power supply voltage VPWR. The reference voltage VREF may be used for determining whether the data signal DQ has a logic high level or a logic high level. For example, the voltage generator 130 may include a switching regulator and/or a linear regulator (e.g., a low dropout (LDO) regulator).

The memory device 120 may communicate with the host 50 via the memory controller 110. The memory device 120 may include a plurality of memory cells, and may include (e.g., may be divided into) a plurality of ranks 122 and 124. Each of the plurality of ranks 122 and 124 may include a plurality of memory cells. As described above with reference to FIG. 1, the memory device 120 may operate at one of a plurality of operating frequencies, and an operating frequency of the memory device 120 may be changed according to the DVFS scheme.

In one or more exemplary embodiments, the memory device 120 may operate in synchronization with the clock signal CLK provided from the host 50, and may be a volatile memory device that loses stored data when disconnected from power. A detailed configuration of the memory device 120 will be described below with reference to FIG. 3.

The power supply device 500 may generate the power supply voltage VPWR based on the second control signal CONT2. The power supply device 500 may provide a power supply voltage (e.g., the power supply voltage VPWR) to the host 50.

In one or more exemplary embodiments, the power supply device 500 may be a power management integrated circuit (PMIC).

An operation of the computing system 10 associated with the method of training for the memory device 120 according to an exemplary embodiment will be described as follows. When the computing system 10 and the memory device 120 are powered on, the host 50 loads the booting codes BC that are stored in the internal memory 70, transmits the booting codes BC to the memory system 100, and performs the initialization operation or the booting operation on the memory device 120. The host 50 performs the training operation on the plurality of operating frequencies of the memory device 120 such that at least one of the plurality of operating parameters of the memory device 120 is obtained as the configurable operating parameter for each of the plurality of operating frequencies. The host 50 and the memory device 120 (e.g., the memory system 100) may exchange training information TINF with each other while the training operation is performed. The host 50 stores the configurable operating parameter for each of the plurality of operating frequencies in the internal memory 70 as the training data TDAT. Subsequently, the host 50 uses the optimized operating parameter for the memory device 120 based on the training data TDAT, the current operation mode of the memory device 120, and the current operating frequency of the memory device 120. In other words, all of operations S100, S200, S300 and S400 are performed by the host 50. For example, operations S100, S200 and S400 may be performed by the processor 60, and operation S300 may be performed by the processor 60 and the internal memory 70.

Figure 3:
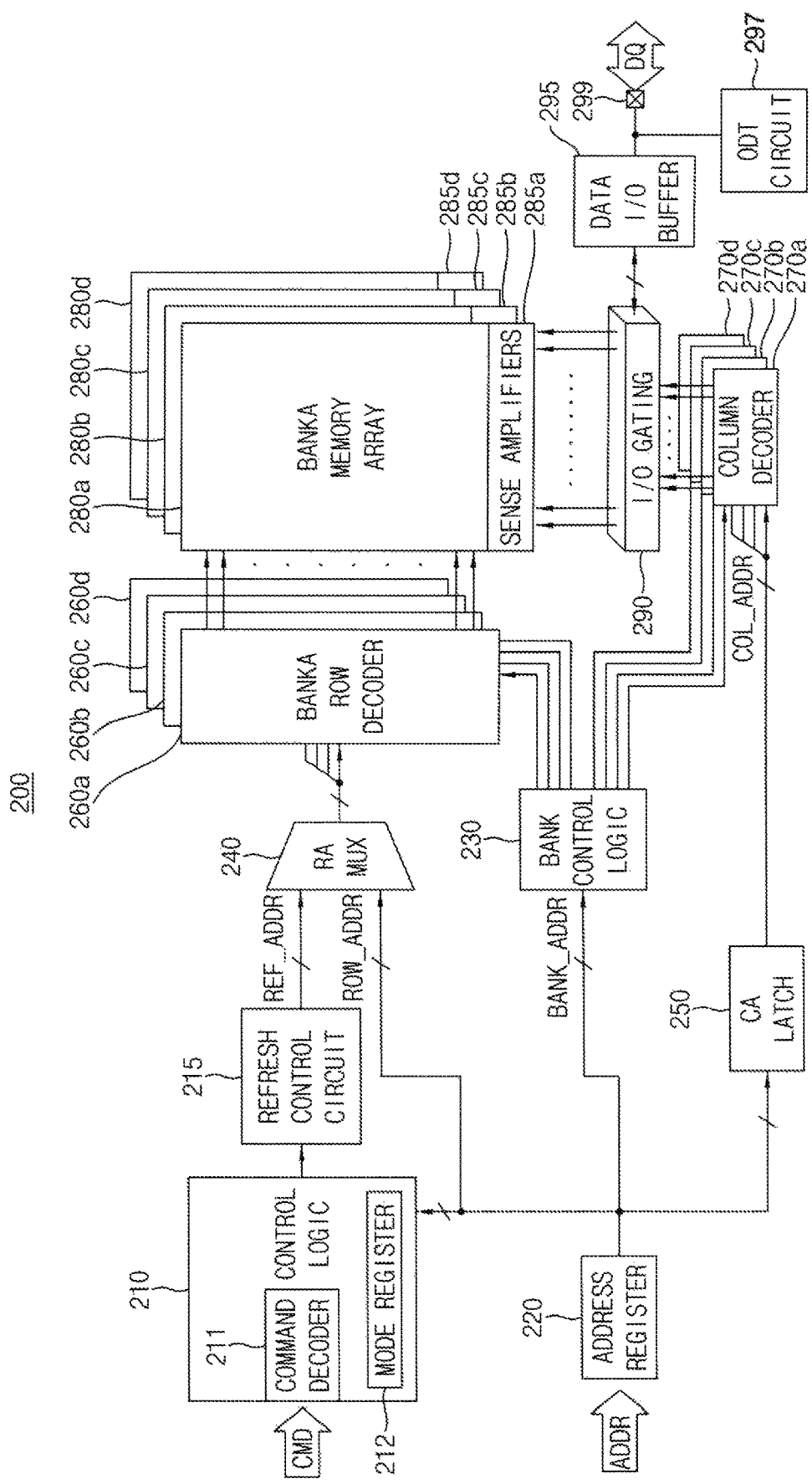
FIG. 3 is a block diagram illustrating an example of a memory device that is included in the computing system of FIG. 2, according to an exemplary embodiment.

FIG. 3 is a block diagram illustrating an example of a memory device 200 that is included in the computing system of FIG. 2, according to an exemplary embodiment.

Referring to FIG. 3, a memory device 200 includes a control logic circuit 210, a refresh control circuit 215, an address register 220, a bank control logic circuit 230, a row address multiplexer 240, a column address latch 250, a row decoder, a column decoder, a memory cell array, a sense amplifier unit (e.g., sense amplifier), an input/output (I/O) gating circuit 290, a data I/O buffer 295, an on-die termination (ODT) circuit 297, and a data I/O pad 299. It is understood that one or more other exemplary embodiments are not limited to the specific combination and number of components shown and described in FIG. 3.

In one or more exemplary embodiments, the memory device 200 may be the memory device 120 in FIG. 2 and may be, by way of example, a volatile memory device. For example, the memory device 200 may be one of various volatile memory devices such as a dynamic random access memory (DRAM), a mobile DRAM, a dual data rate (DDR) DRAM, a low power DDR (LPDDR) DRAM, a graphic DDR (GDDR) DRAM, or the like.

The memory cell array includes a plurality of memory cells. The memory cell array may include a plurality of bank arrays, e.g., first through fourth bank arrays 280a, 280b, 280c and 280d. The row decoder may include a plurality of bank row decoders, e.g., first through fourth bank row decoders 260a, 260b, 260c and 260d respectively connected to the first through fourth bank arrays 280a, 280b, 280c and 280d. The column decoder may include a plurality of bank column decoders, e.g., first through fourth bank column decoders 270a, 270b, 270c and 270d respectively connected to the first through fourth bank arrays 280a, 280b, 280c and 280d. The sense amplifier unit may include a plurality of bank sense amplifiers, e.g., first through fourth bank sense amplifiers 285a, 285b, 285c and 285d respectively connected to the first through fourth bank arrays 280a, 280b, 280c and 280d.

The first through fourth bank arrays 280a-280d, the first through fourth bank row decoders 260a-260d, the first through fourth bank column decoders 270a-270d, and the first through fourth bank sense amplifiers 285a-285d may form first through fourth banks, respectively. For example, the first bank array 280a, the first bank row decoder 260a, the first bank column decoder 270a, and the first bank sense amplifier 285a may form the first bank; the second bank array 280b, the second bank row decoder 260b, the second bank column decoder 270b, and the second bank sense amplifier 285b may form the second bank; the third bank array 280c, the third bank row decoder 260c, the third bank column decoder 270c, and the third bank sense amplifier 285c may form the third bank; and the fourth bank array 280d, the fourth bank row decoder 260d, the fourth bank column decoder 270d, and the fourth bank sense amplifier 285d may form the fourth bank. Although FIG. 3 illustrates the memory device 200 including four banks, it is understood that one or more other exemplary embodiments are not limited thereto, and the memory device 200 may include any number of banks. It is also understood that while the components shown in FIG. 3 in quantities of four have a one-to-one correspondence with each other, one or more other exemplary embodiments are not limited thereto. For example, there could be more or less decoders or sensors than shown.

The address register 220 may receive an address ADDR including a bank address BANK_ADDR, a row address ROW_ADDR, and a column address COL_ADDR from a memory controller (e.g., the memory controller 110 in FIG. 2). The address register 220 may provide the received bank address BANK_ADDR to the bank control logic circuit 230, may provide the received row address ROW_ADDR to the row address multiplexer 240, and may provide the received column address COL_ADDR to the column address latch 250.

The bank control logic circuit 230 may generate bank control signals in response to receipt of the bank address BANK_ADDR. One of the first through fourth bank row decoders 260a-260d corresponding to the received bank address BANK_ADDR may be activated in response to the bank control signals generated by the bank control logic circuit 230, and one of the first through fourth bank column decoders 270a-270d corresponding to the received bank address BANK_ADDR may be activated in response to the bank control signals generated by the bank control logic circuit 230.

The refresh control circuit 215 may generate a refresh address REF_ADDR in response to receipt of a refresh command or entrance of any self refresh mode. For example, the refresh control circuit 215 may include a refresh counter that is configured to sequentially change the refresh address REF_ADDR from a first address of the memory cell array to a last address of the memory cell array. The refresh control circuit 215 may receive control signals from the control logic circuit 210.

The row address multiplexer 240 may receive the row address ROW_ADDR from the address register 220, and may receive the refresh address REF_ADDR from the refresh control circuit 215. The row address multiplexer 240 may selectively output the row address ROW_ADDR or the refresh address REF_ADDR. A row address output from the row address multiplexer 240 (e.g., the row address ROW_ADDR or the refresh address REF_ADDR) may be applied to the first through fourth bank row decoders 260a-260d.

The activated one of the first through fourth bank row decoders 260a-260d may decode the row address output from the row address multiplexer 240, and may activate a wordline corresponding to the row address. For example, the activated bank row decoder may apply a wordline driving voltage to the wordline corresponding to the row address.

The column address latch 250 may receive the column address COL_ADDR from the address register 220, and may temporarily store the received column address COL_ADDR. The column address latch 250 may apply the temporarily stored or received column address COL_ADDR to the first through fourth bank column decoders 270a-270d.

The activated one of the first through fourth bank column decoders 270a-270d may decode the column address COL_ADDR output from the column address latch 250, and may control the I/O gating circuit 290 to output data corresponding to the column address COL_ADDR.

The I/O gating circuit 290 may include a circuitry for gating I/O data. For example, the I/O gating circuit 290 may include an input data mask logic, read data latches for storing data output from the first through fourth bank arrays 280a-280d, and write drivers for writing data to the first through fourth bank arrays 280a-280d.

Data DQ to be read from one of the first through fourth bank arrays 280a-280d may be sensed by a sense amplifier coupled to the corresponding bank array, and may be stored in the read data latches. The data DQ stored in the read data latches may be provided to the memory controller via the data I/O buffer 295 and the data I/O pad 299. Data DQ received via the data I/O pad 299 that is to be written to one of the first through fourth bank arrays 280a-280d may be provided from the memory controller to the data I/O buffer 295. The data DQ received via the data I/O pad 299 and provided to the data I/O buffer 295 may be written to the corresponding bank array via the write drivers in the I/O gating circuit 290.

The control logic circuit 210 may control an operation of the memory device 200. For example, the control logic circuit 210 may generate control signals for the memory device 200 to perform a data write operation or a data read operation. The control logic circuit 210 may include a command decoder 211 that decodes a command CMD received from the memory controller and a mode register 212 that sets an operation mode of the memory device 200. For example, the command decoder 211 may generate the control signals corresponding to the command CMD by decoding a write enable signal (e.g., /WE), a row address strobe signal (e.g., /RAS), a column address strobe signal (e.g., /CAS), a chip select signal (e.g., /CS), etc. The control logic circuit 210 may further receive a clock signal (e.g., CLK) and a clock enable signal (e.g., /CKE) for operating the memory device 200 in a synchronous manner.

The ODT circuit 297 may be connected to the data I/O pad 299 and the data I/O buffer 295. When the ODT circuit 297 is enabled, an ODT operation may be performed. The ODT operation may reduce (and/or prevent) a signal from being reflected by using a termination resistor so as to improve signal integrity.

Figure 4:
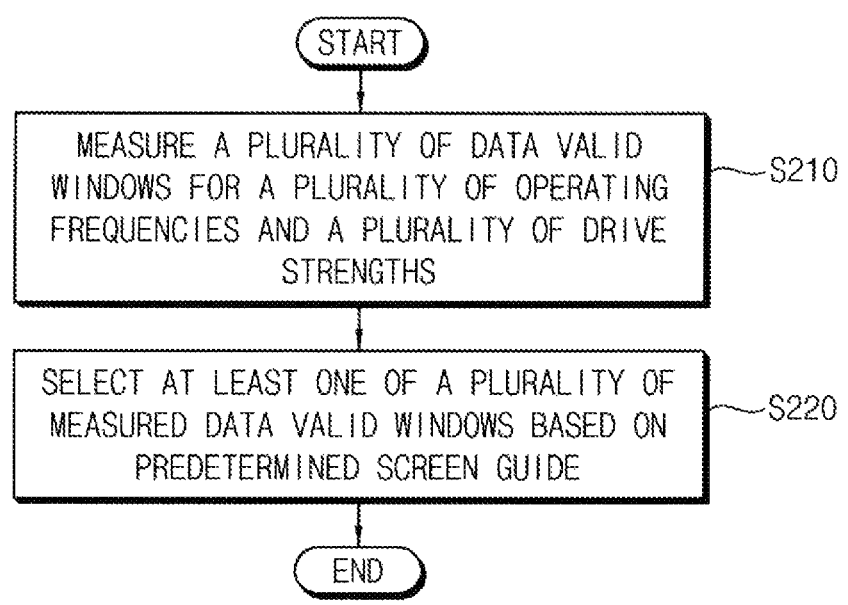
FIG. 4 is a flowchart illustrating an example of performing a training operation in FIG. 1, according to an exemplary embodiment.
Figure 5A:
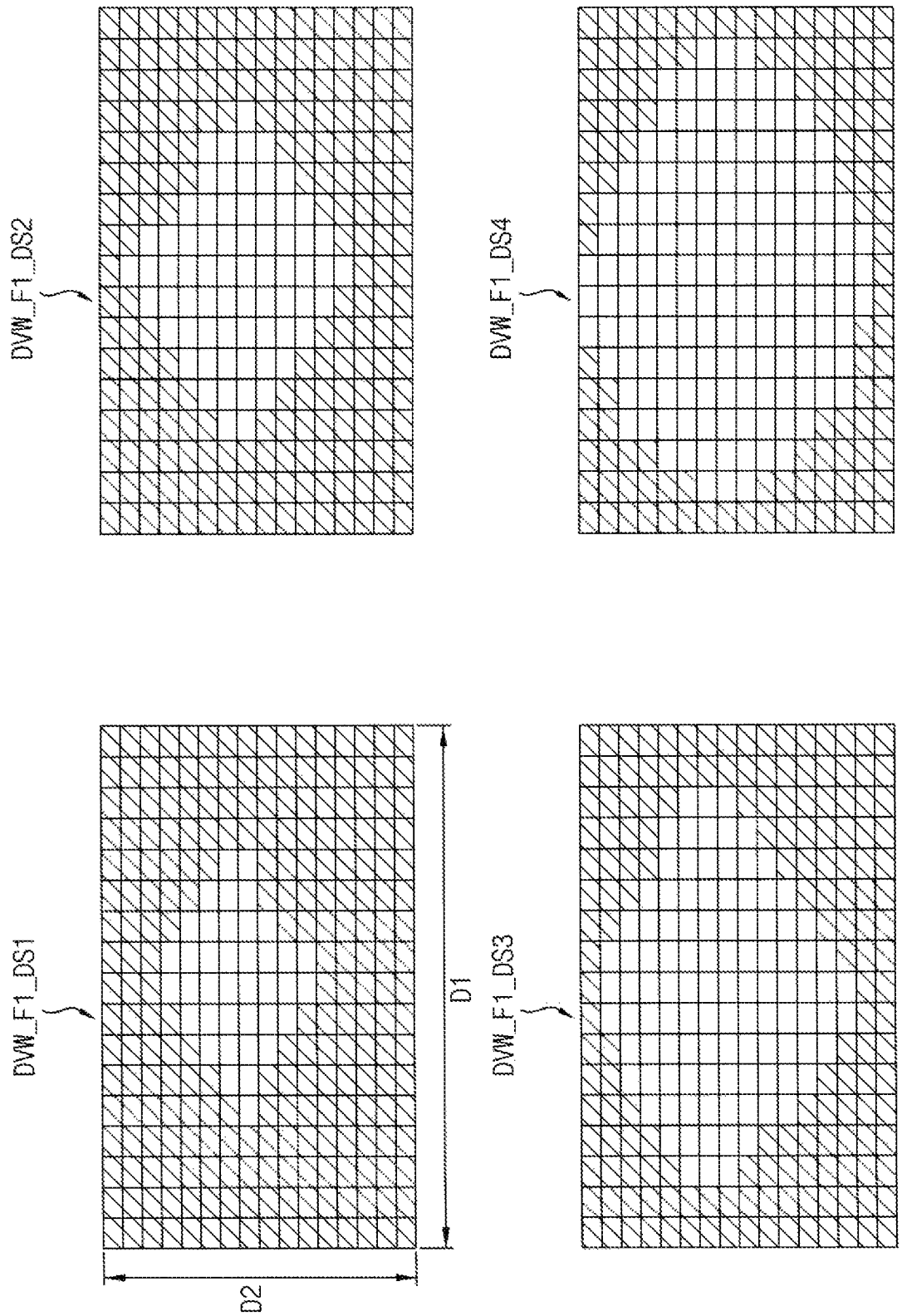
FIGS. 5A and 5B are diagrams for describing the training operation of FIG. 4, according to an exemplary embodiment.
Figure 5B:
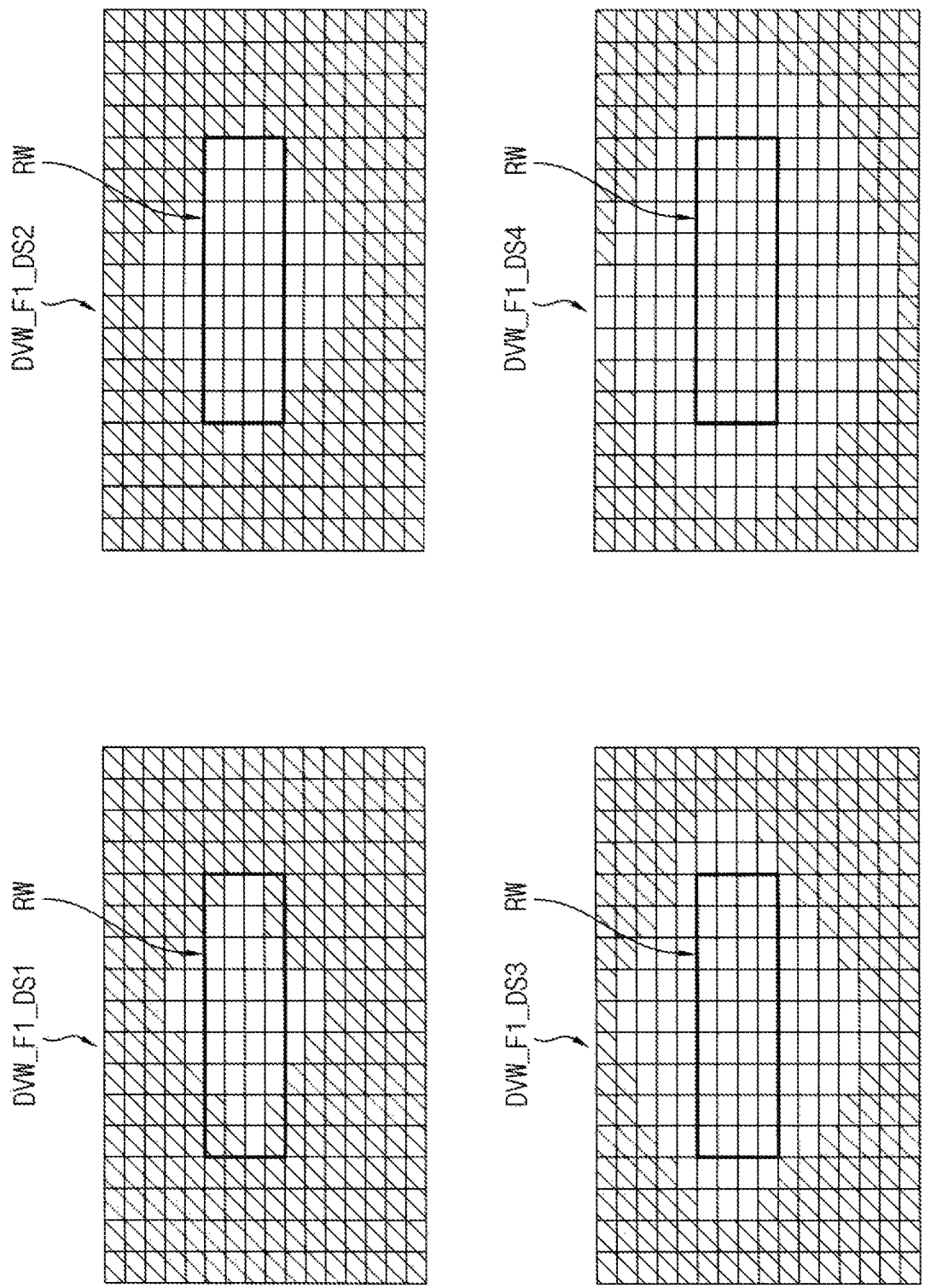

FIG. 4 is a flowchart illustrating an example of performing a training operation in FIG. 1, according to an exemplary embodiment. FIGS. 5A and 5B are diagrams for describing the training operation of FIG. 4, according to an exemplary embodiment. FIG. 6 is a diagram for describing an example of storing configurable operating parameters for each of a plurality of operating frequencies as training data in FIG. 1, according to an exemplary embodiment.

Referring to FIGS. 1, 2, 4, 5A and 5B, the plurality of operating parameters of the memory device 120 may include a plurality of drive strengths of the memory device 120. A drive strength may be referred to as a drive capability. Generally, as a drive strength of the memory device 120 increases, an operating stability and current consumption of the memory device 120 may increase.

In performing the training operation (e.g., in operation S200 of FIG. 1), a plurality of data valid windows of the memory device 120 may be measured for the plurality of operating frequencies and for the plurality of drive strengths (operation S210).

In one or more exemplary embodiments, the plurality of drive strengths may include a first drive strength DS1, a second drive strength DS2, a third drive strength DS3, and a fourth drive strength DS4. In this example, data valid windows for the first through fourth drive strengths DS1, DS2, DS3 and DS4 may be measured for each of the plurality of operating frequencies of the memory device 120.

As illustrated in FIG. 5A, data valid windows may be measured for a first operating frequency F1 among the plurality of operating frequencies of the memory device 120. For example, a data valid window DVW_F1_DS1 may be measured for the first operating frequency F1 and the first drive strength DS1, a data valid window DVW_F1_DS2 may be measured for the first operating frequency F1 and the second drive strength DS2, a data valid window DVW_F1_DS3 may be measured for the first operating frequency F1 and the third drive strength DS3, and a data valid window DVW_F1_DS4 may be measured for the first operating frequency F1 and the fourth drive strength DS4.

In FIG. 5A, each data valid window is illustrated as a rectangle including 17*16 (width*height) rectangular blocks. Among a plurality of rectangular blocks, an empty rectangular block represents a valid region or a pass region in which data is determined to be valid, and a hatched rectangular block represents an invalid region or a fail region in which data is determined to be invalid.

In one or more exemplary embodiments, values of the drive strengths may increase as in an order of the first, second, third, and fourth drive strengths DS1, DS2, DS3 and DS4. In other words, among the first through fourth drive strengths DS1, DS2, DS3 and DS4, the first drive strength DS1 may have a minimum value, and the fourth drive strength DS4 may have a maximum value. Generally, a total area of a valid region in a data valid window may increase as a value of a drive strength increases (e.g., the total area of the valid region may be proportionate to the value of the drive strength), and thus a total area of a valid region in the data valid window DVW_F1_DS1 may have the smallest size, and a total area of a valid region in the data valid window DVW_F1_DS4 may have the largest size.

In one or more exemplary embodiments, in measuring the plurality of data valid windows (e.g., in operation S210), first ranges of the plurality of data valid windows may be measured based on the data signal DQ and the data strobe signal DQS, and second ranges of the plurality of data valid windows may be measured based on the reference voltage VREF. Each of the first ranges may be along a first direction D1, and each of the second ranges may be along a second direction D2 crossing the first direction D1. For example, the second direction D2 may be perpendicular to the first direction D1.

For example, a range of the data valid window DVW_F1_DS1 along the first direction D1 may be measured, based on the clock signal CLK, by fixing one of the data signal DQ and the data strobe signal DQS and by shifting the other of the data signal DQ and the data strobe signal DQS. Generally, the data signal DQ or the data strobe signal DQS may be repeatedly transitioned (e.g., toggled) from one of a logic high level and a logic low level to the other of the logic high level and the logic low level over time (e.g., per predetermined time interval). In other words, rising edges and falling edges may be repeated in the data signal DQ or the data strobe signal DQS. For example, the data signal DQ may be fixed, the data strobe signal DQS may be repeatedly shifted in the first direction D1 by a predetermined unit (e.g., by a width of each rectangular block), and thus a valid range of the data signal DQ may be measured at each rising edge or each falling edge of the data strobe signal DQS. As a result, the range of the data valid window DVW_F1_DS1 along the first direction D1 may be measured.

In addition, a range of the data valid window DVW_F1_DS1 along the second direction D2 may be measured by shifting a level of the reference voltage VREF that is generated based on the power supply voltage VPWR. As described above with reference to FIG. 2, the reference voltage VREF may be used for determining whether the data signal DQ has a logic low level or a logic high level. For example, the data signal DQ may be fixed, the level of the reference voltage VREF may be repeatedly shifted in the second direction D2 by a predetermined unit (e.g., by a height of each rectangular block), and thus a valid range of the data signal DQ may be measured at each level of the reference voltage VREF. As a result, the range of the data valid window DVW_F1_DS1 along the second direction D2 may be measured.

After measuring the plurality of data valid windows (e.g., after operation S210), at least one of the plurality of measured data valid windows may be selected based on a predetermined screen guide (operation S220). For example, at least one data valid window that satisfies or fulfills the predetermined screen guide may be selected.

In one or more exemplary embodiments, the predetermined screen guide may be represented as a reference window, and a data valid window may be determined to satisfy or fulfill the predetermined screen guide when the total area of the valid region in the data valid window includes the reference window. For example, as illustrated in FIG. 5B, hatched rectangular blocks may be included in a reference window RW in the data valid window DVW_F1_DS1, and thus it may be determined that the data valid window DVW_F1_DS1 does not satisfy the predetermined screen guide. Only empty rectangular blocks may be included in the reference window RW in each of the data valid windows DVW_F1_DS2, DVW_F1_DS3 and DVW_F1_DS4, and thus it may be determined that each of the data valid windows DVW_F1_DS2, DVW_F1_DS3 and DVW_F1_DS4 satisfies the predetermined screen guide. As a result, the data valid windows DVW_F1_DS2, DVW_F1_DS3 and DVW_F1_DS4 may be selected for the first operating frequency F1 in operation S220.

In FIG. 5B, the reference window RW is illustrated as a rectangle including 9*4 (width*height) rectangular blocks. If it is assumed that a coordinate of the leftmost and uppermost rectangular block in each data valid window is (1,1), a coordinate of the leftmost and uppermost rectangular block in the reference window RW is (5,6).

Although the exemplary embodiment described above with reference to FIGS. 5A and 5B is based on an example where the data valid windows DVW_F1_DS1, DVW_F1_DS2, DVW_F1_DS3, and DVW_F1_DS4 are measured for the first operating frequency F1 and at least one of the data valid windows DVW_F1_DS1, DVW_F1_DS2, DVW_F1_DS3, and DVW_F1_DS4 is selected for the first operating frequency F1 based on the reference window RW, it is understood that one or more other exemplary embodiments are not limited thereto. For example, data valid windows may be further measured for the plurality of operating frequencies other than the first operating frequency F1 (e.g., a second operating frequency F2, etc.), and at least one of the measured data valid windows may be further selected for the plurality of operating frequencies other than the first operating frequency F1.

Referring to FIGS. 1, 2, and 6, after performing the training operation (e.g., after operation S200 in FIG. 1), the configurable operating parameter for each of the plurality of operating frequencies is stored as the training data TDAT (operation S300 in FIG. 1). For example, the training data TDAT may be stored in the internal memory 70 included in the host 50.

In one or more exemplary embodiments, a relationship between the plurality of operating frequencies of the memory device 120 and configurable drive strengths for the plurality of operating frequencies may be stored as the training data TDAT based on the at least one selected data valid window that is obtained by operation S220 in FIG. 4. For example, as illustrated in FIG. 6, the training data TDAT may be stored as a type of table that includes the plurality of operating frequencies and corresponding configurable drive strengths. As described above with reference to FIGS. 5A and 5B, the second, third and fourth drive strengths DS2, DS3 and DS4 may be registered as configurable drive strengths for the first operating frequency F1. Similarly, the third and fourth drive strengths DS3 and DS4 may be registered as configurable drive strengths for the second operating frequency F2, and configurable drive strengths may be registered for other operating frequencies.

After storing the training data TDAT (e.g., after operation S300 in FIG. 1), the optimized operating parameter for the memory device 120 is used based on the training data TDAT, the current operation mode of the memory device 120, and the current operating frequency of the memory device 120 (operation S400). As described above with reference to FIGS. 4 through 6, the plurality of operating parameters may include the plurality of drive strengths, and thus an optimized drive strength may be used in operation S400.

In one or more exemplary embodiments, an operation mode of the memory device 120 may include a low power mode. When the current operation mode is the low power mode, a minimum drive strength among the configurable drive strengths for the current operating frequency may be determined as the optimized operating parameter because the current consumption of the memory device 120 increases (or decreases) as the drive strength of the memory device 120 increases (or decreases) as described above. For example, when the current operation mode is the low power mode, and when the current operating frequency is the first operating frequency F1, the second drive strength DS2 may be determined as the optimized operating parameter.

In one or more exemplary embodiments, the operation mode of the memory device 120 may include a high performance mode. When the current operation mode is the high performance mode, a maximum drive strength among the configurable drive strengths for the current operating frequency may be determined as the optimized operating parameter because the operating stability of the memory device 120 increases as the drive strength of the memory device 120 increases, as described above. For example, when the current operation mode is the high performance mode, and when the current operating frequency is the first operating frequency F1, the fourth drive strength DS4 may be determined as the optimized operating parameter.

In one or more exemplary embodiments, when the operating frequency of the memory device 120 is changed according to the DVFS scheme, the optimized drive strength may also be changed.

Figure 7:
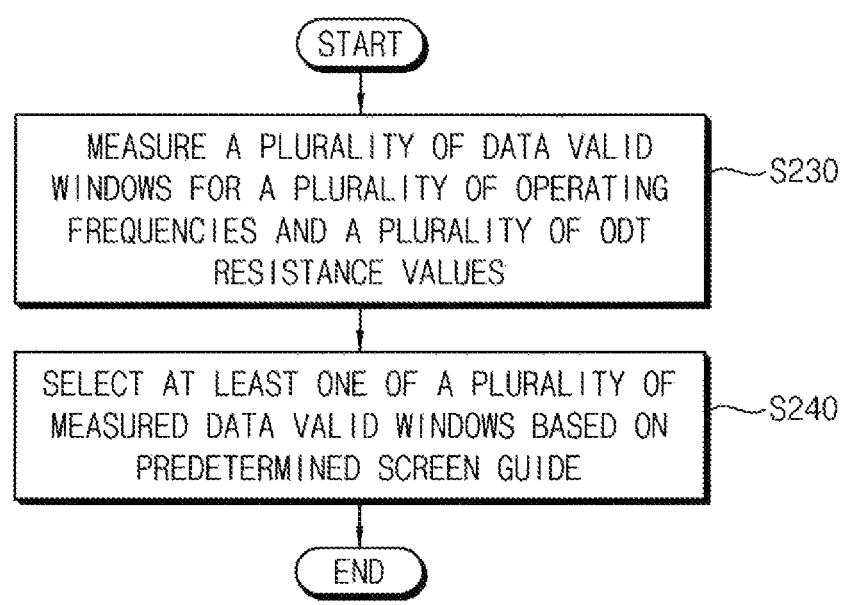
FIG. 7 is a flowchart illustrating another example of performing a training operation in FIG. 1, according to an exemplary embodiment.
Figure 8A:
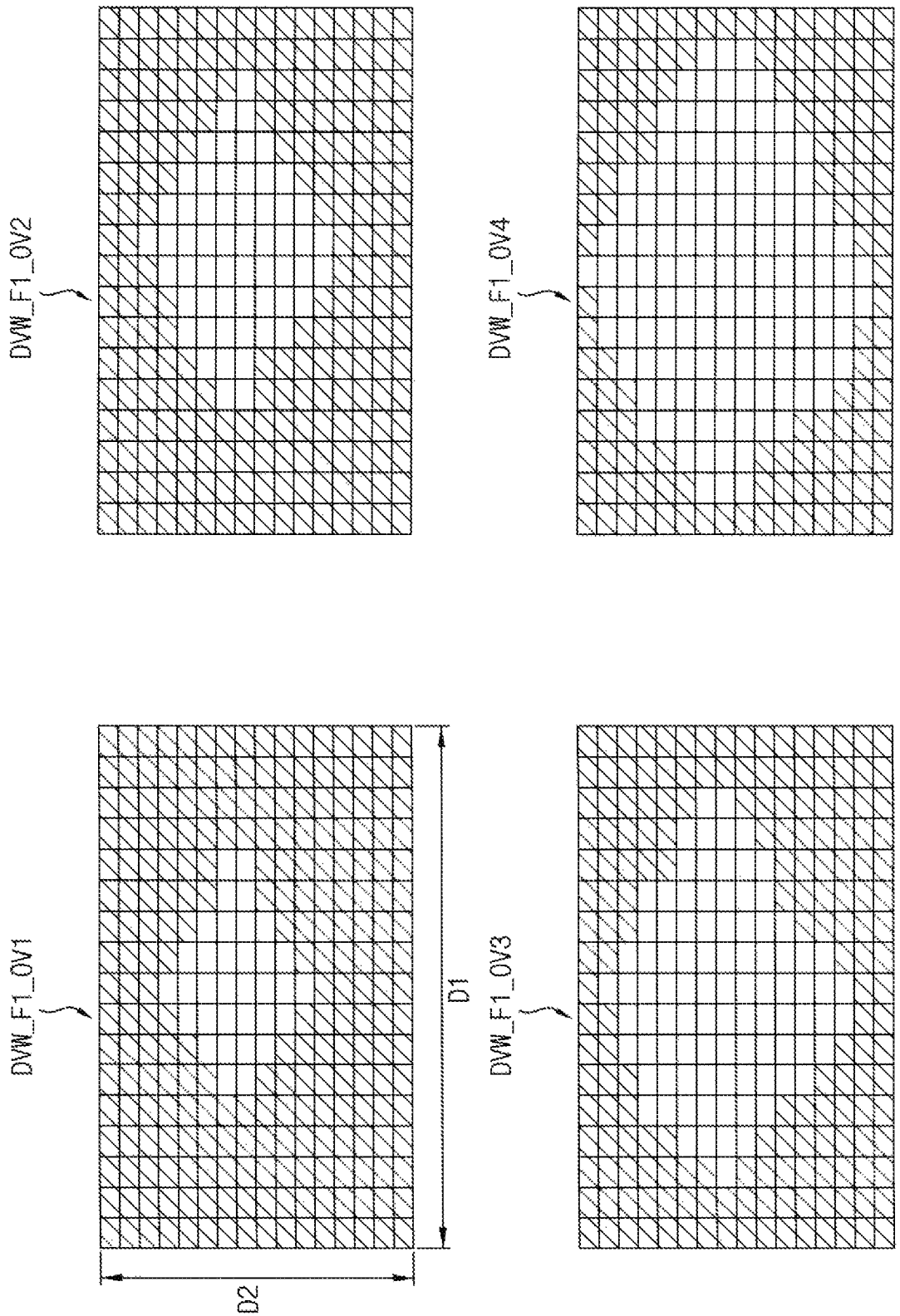

FIG. 7 is a flowchart illustrating another example of performing a training operation in FIG. 1, according to an exemplary embodiment. FIGS. 8A and 8B are diagrams for describing the training operation of FIG. 7, according to an exemplary embodiment. FIG. 9 is a diagram for describing another example of storing configurable operating parameters for each of a plurality of operating frequencies as training data in FIG. 1, according to an exemplary embodiment.

Referring to FIGS. 1, 2, 7, 8A, and 8B, the plurality of operating parameters of the memory device 120 may include a plurality of ODT resistance values of the memory device 120. As described above, an ODT operation may be performed by an ODT circuit (e.g., the ODT circuit 297 in FIG. 3) that provides a signal transmission line with a termination resistance component for impedance matching. The ODT operation may reduce (and/or prevent) a signal from being reflected by using a termination resistor so as to improve signal integrity. For example, the ODT resistance value may represent a resistance of the termination resistor.

In performing the training operation (e.g., in operation S200 in FIG. 1), a plurality of data valid windows of the memory device 120 may be measured for the plurality of operating frequencies and for the plurality of ODT resistance values (operation S230). Operation S230 may be similar to operation S210 in FIG. 4.

In one or more exemplary embodiments, the plurality of ODT resistance values may include a first ODT resistance value OV1, a second ODT resistance value OV2, a third ODT resistance value OV3, and a fourth ODT resistance value OV4. In this example, data valid windows for the first through fourth ODT resistance values OV1, OV2, OV3, and OV4 may be measured for each of the plurality of operating frequencies of the memory device 120.

As illustrated in FIG. 8A, data valid windows may be measured for the first operating frequency F1 among the plurality of operating frequencies of the memory device 120. For example, a data valid window DVW_F1_OV1 may be measured for the first operating frequency F1 and the first ODT resistance value OV1, a data valid window DVW_F1_OV2 may be measured for the first operating frequency F1 and the second ODT resistance value OV2, a data valid window DVW_F1_OV3 may be measured for the first operating frequency F1 and the third ODT resistance value OV3, and a data valid window DVW_F1_OV4 may be measured for the first operating frequency F1 and the fourth ODT resistance value OV4.

In one or more exemplary embodiments, the ODT resistance values may decrease as in an order of the first, second, third, and fourth ODT resistance values OV1, OV2, OV3, and OV4. In other words, among the first through fourth ODT resistance values OV1, OV2, OV3, and OV4, the first ODT resistance value OV1 may have a maximum value, and the fourth ODT resistance value OV4 may have a minimum value. Generally, a total area of a valid region in a data valid window may decrease as an ODT resistance value increases (e.g., the total area of the valid region may be inversely proportionate to the ODT resistance value), and thus a total area of a valid region in the data valid window DVW_F1_OV1 may have the smallest size, and a total area of a valid region in the data valid window DVW_F1_OV4 may have the largest size.

In one or more exemplary embodiments, in measuring the plurality of data valid windows (e.g., in operation S230), first ranges of the plurality of data valid windows may be measured based on the data signal DQ and the data strobe signal DQS, and second ranges of the plurality of data valid windows may be measured based on the reference voltage VREF. Each of the first ranges may be along the first direction D1, and each of the second ranges may be along the second direction D2 crossing the first direction D1. For example, as with the example described above with reference to FIG. 5A, a range of the data valid window DVW_F1_OV1 along the first direction D1 may be measured, based on the clock signal CLK, by fixing one of the data signal DQ and the data strobe signal DQS and by shifting the other of the data signal DQ and the data strobe signal DQS. A range of the data valid window DVW_F1_OV1 along the second direction D2 may be measured by shifting the level of the reference voltage VREF.

After measuring the plurality of data valid windows (e.g., after operation S230), at least one of the plurality of measured data valid windows may be selected based on a predetermined screen guide (operation S240). Operation S240 may be similar to operation S220 in FIG. 4.

In one or more exemplary embodiments, the predetermined screen guide may be represented as the reference window, and a data valid window may be determined to satisfy or fulfill the predetermined screen guide when the total area of the valid region in the data valid window includes the reference window. For example, as illustrated in FIG. 8B, hatched rectangular blocks may be included in the reference window RW in the data valid windows DVW_F1_OV1 and DVW_F1_OV2, and thus it may be determined that each of the data valid windows DVW_F1_OV1 and DVW_F1_OV2 does not satisfy the predetermined screen guide. Only empty rectangular blocks may be included in the reference window RW in each of the data valid windows DVW_F1_OV3 and DVW_F1_OV4, and thus it may be determined that each of the data valid windows DVW_F1_OV3 and DVW_F1_OV4 satisfies the predetermined screen guide. As a result, the data valid windows DVW_F1_OV3 and DVW_F1_OV4 may be selected for the first operating frequency F1 in operation S240.

A size of each data valid window and a size and location of the reference window RW in FIGS. 8A and 8B may be substantially the same as that of each data valid window and those of the reference window RW in FIGS. 5A and 5B, respectively. In one or more exemplary embodiments, the size and/or location of the reference window associated with the drive strength (e.g., the reference window RW in FIG. 5B) may be different from the size and/or location of the reference window associated with the ODT resistance value (e.g., the reference window RW in FIG. 8B).

Although the exemplary embodiment described above with reference to FIGS. 8A and 8B is based on an example where the data valid windows DVW_F1_OV1, DVW_F1_OV2, DVW_F1_OV3, and DVW_F1_OV4 are measured for the first operating frequency F1 and at least one of the data valid windows DVW_F1_OV1, DVW_F1_OV2, DVW_F1_OV3, and DVW_F1_OV4 is selected for the first operating frequency F1 based on the reference window RW, it is understood that one or more other exemplary embodiments are not limited thereto. For example, data valid windows may be further measured for the plurality of operating frequencies other than the first operating frequency F1 (e.g., the second operating frequency F2, etc.), and at least one of the measured data valid windows may be further selected for the plurality of operating frequencies other than the first operating frequency F1.

Referring to FIGS. 1, 2, and 9, after performing the training operation (e.g., after operation S200 in FIG. 1), the configurable operating parameter for each of the plurality of operating frequencies is stored as the training data TDAT (operation S300 in FIG. 1).

In one or more exemplary embodiments, a relationship between the plurality of operating frequencies of the memory device 120 and configurable ODT resistance values for the plurality of operating frequencies may be stored as the training data TDAT based on the at least one selected data valid window that is obtained by operation S240 in FIG. 7. For example, as illustrated in FIG. 9, the training data TDAT may be stored as a type of table that includes the plurality of operating frequencies and corresponding configurable ODT resistance values. As described above with reference to FIGS. 8A and 8B, the third and fourth ODT resistance values OV3 and OV4 may be registered as configurable ODT resistance values for the first operating frequency F1. Similarly, the second, third, and fourth drive strengths OV2, OV3 and OV4 may be registered as configurable ODT resistance values for the second operating frequency F2, and configurable ODT resistance values may be registered for other operating frequencies.

After storing the training data TDAT (e.g., after operation S300 in FIG. 1), the optimized operating parameter for the memory device 120 is used based on the training data TDAT, the current operation mode of the memory device 120, and the current operating frequency of the memory device 120 (operation S400 in FIG. 1). As described above with reference to FIGS. 7 through 9, the plurality of operating parameters may include the plurality of ODT resistance values, and thus an optimized ODT resistance value may be used in operation S400.

In one or more exemplary embodiments, when the current operation mode is the low power mode, a maximum ODT resistance value among the configurable ODT resistance values for the current operating frequency may be determined as the optimized operating parameter. In one or more exemplary embodiments, when the current operation mode is the high performance mode, a minimum ODT resistance value among the configurable ODT resistance values for the current operating frequency may be determined as the optimized operating parameter. In one or more exemplary embodiments, when the operating frequency of the memory device 120 is changed according to the DVFS scheme, the optimized ODT resistance value may also be changed.

In one or more exemplary embodiments, the plurality of operating parameters of the memory device 120 may include both the plurality of drive strengths described above with reference to FIGS. 4 through 6 and the plurality of ODT resistance values described above with reference to FIGS. 7 through 9. In this example, a plurality of data valid windows of the memory device 120 may be measured for the plurality of operating frequencies, for the plurality of drive strengths, and for the plurality of ODT resistance values, at least one of the plurality of measured data valid windows may be selected based on the predetermined screen guide, the configurable operating parameter (e.g., both the drive strength and the ODT resistance value) for each of the plurality of operating frequencies is stored as the training data TDAT, and the optimized operating parameter for the memory device 120 is used based on the training data TDAT.

Although the exemplary embodiments described above with reference to FIGS. 4 through 9 are based on the specific number of operating frequencies, drive strengths, and ODT resistance values, it is understood that one or more other exemplary embodiments is not limited thereto. For example, exemplary embodiments may be employed for training any memory device having any number of operating frequencies, drive strengths, and ODT resistance values. Although one or more exemplary embodiments are described above based on an example where the plurality of operating parameters include at least one of the plurality of drive strengths described and the plurality of ODT resistance values, it is understood that one or more other exemplary embodiments is not limited thereto. For example, exemplary embodiments may be employed for determining any optimized operating parameter for each operating frequency of the memory device based on the training operation.

Although exemplary embodiments described above with reference to FIGS. 1 through 9 are based on an example where one optimized operating parameter is determined for the current operation mode and the current operating frequency of the memory device 120, it is understood that one or more other exemplary embodiments is not limited thereto. For example, it is understood that exemplary embodiments may be employed for determining two or more optimized operating parameters for the current operation mode and the current operating frequency of the memory device 120. For example, as illustrated in FIG. 2, when the memory device 120 includes the plurality of ranks 122 and 124, the optimized operating parameter may be differently determined and used for each of the plurality of ranks 122 and 124. For example, when the current operation mode is the low power mode, and when the current operating frequency is the first operating frequency F1, the second drive strength DS2 may be determined as the optimized operating parameter for the rank 122 (e.g., first rank), and the third drive strength DS3 may be determined as the optimized operating parameter for the rank 124 (e.g., second rank).

In the method of training for the memory device according to one or more exemplary embodiments, and the computing system and the host (e.g., the SOC) performing the method according to one or more exemplary embodiments, the configurable operating parameters (e.g., the drive strengths, the ODT resistance values, etc.) for different operating frequencies of the memory device may be determined based on the training operation when the memory device is powered on. Accordingly, for various types of memory devices by different vendors, densities, processes, etc., optimized operating parameter may be efficiently determined and used based on the operating frequency and the operation mode. Thus, both conditions or criteria of the operating stability and the low power consumption may be satisfied while the memory device operates or is driven.

Figure 10:
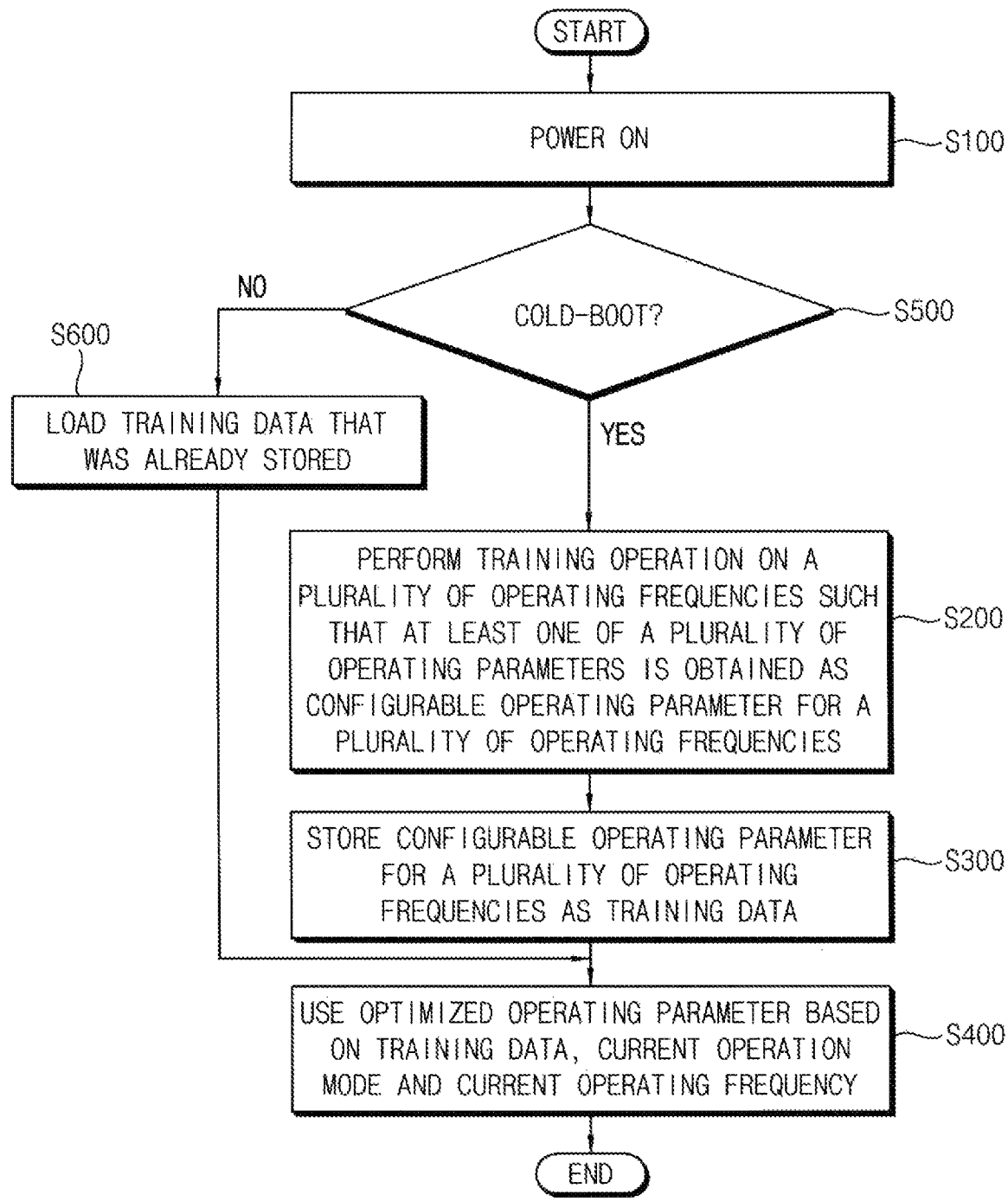
FIGS. 10, 11 and 12 are flowcharts illustrating methods of training for a memory device according to one or more exemplary embodiments.
Figure 11:
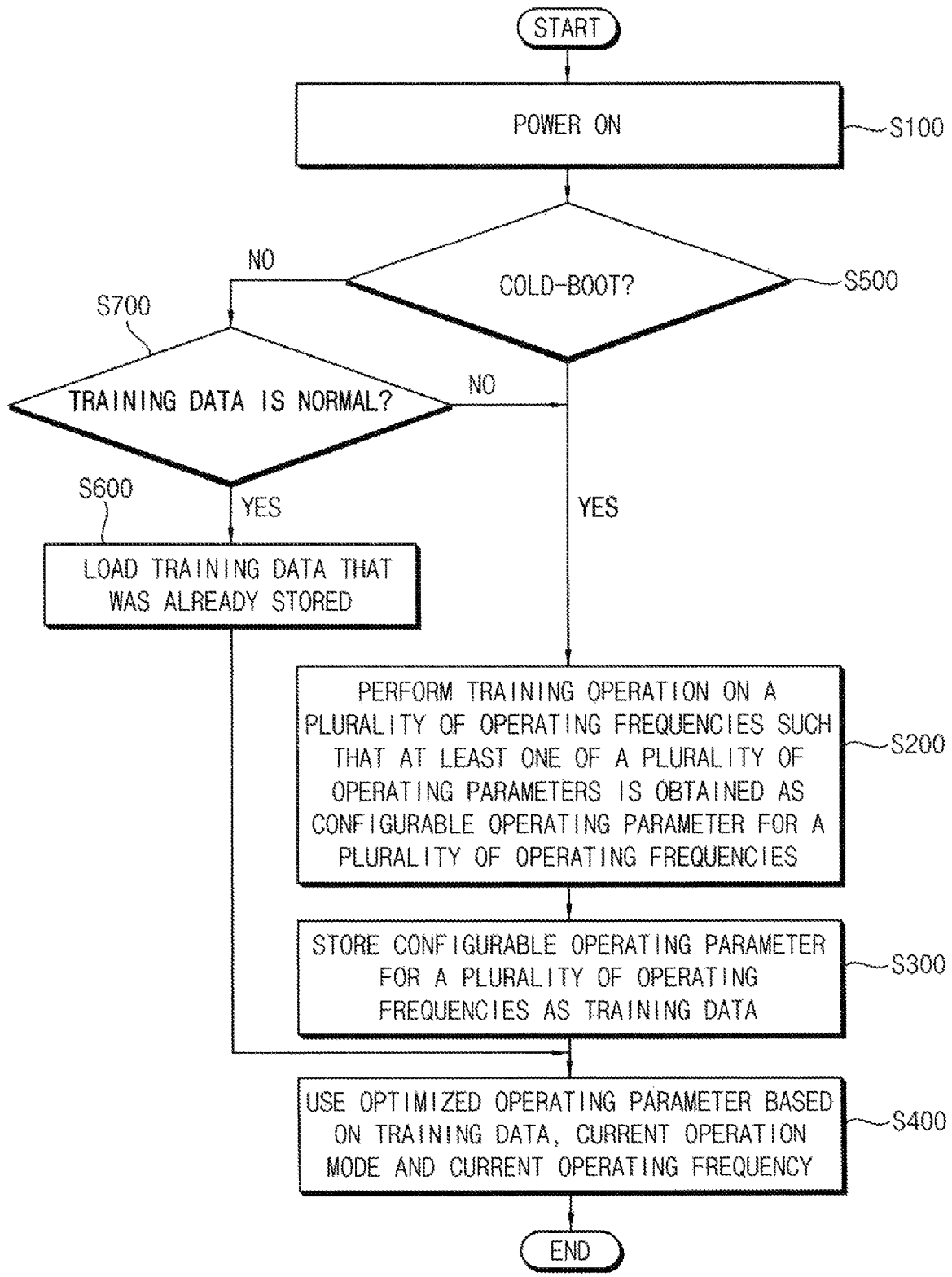
Figure 12:
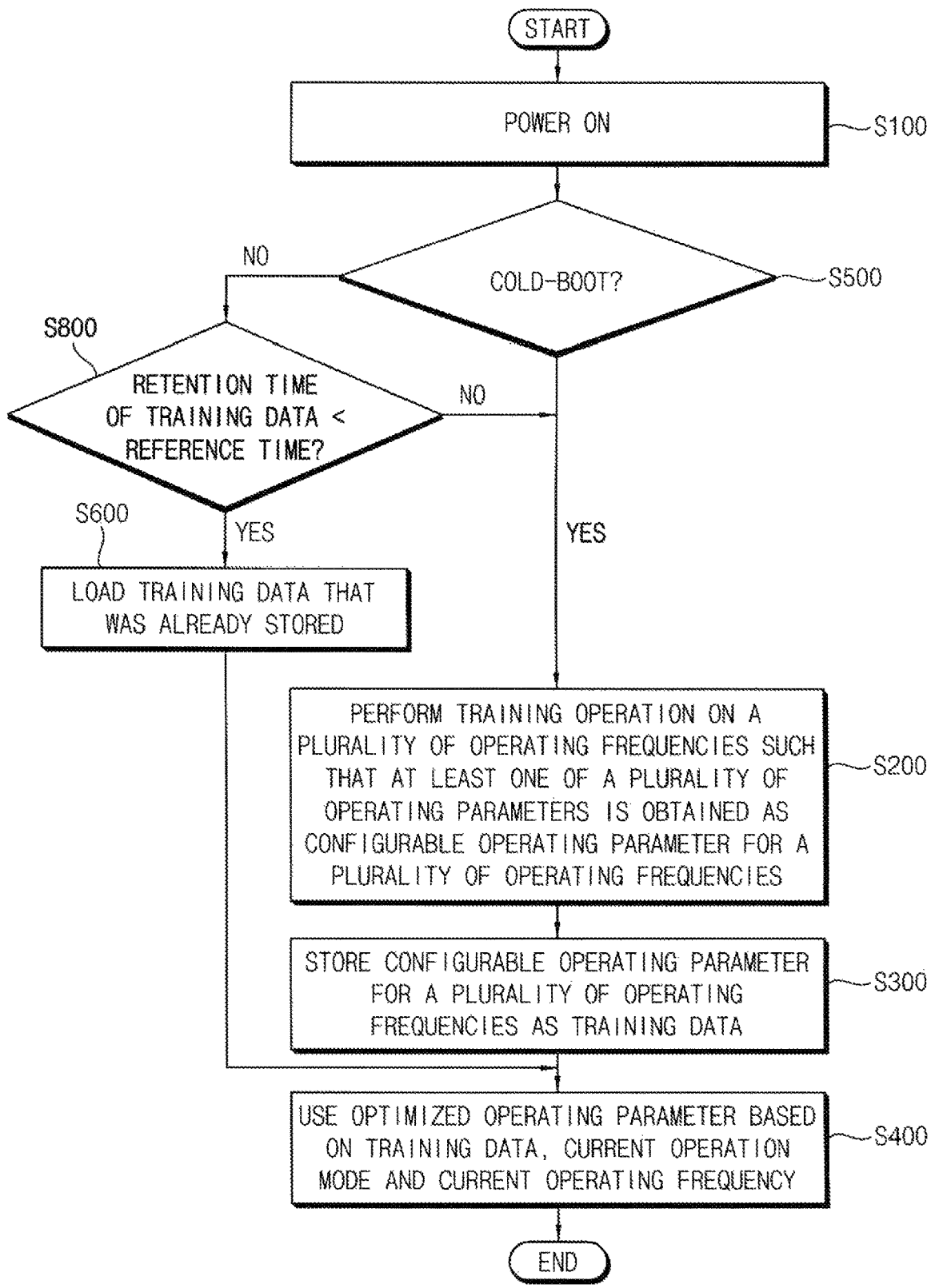

FIGS. 10, 11 and 12 are flowcharts illustrating methods of training for a memory device according to one or more exemplary embodiments.

Referring to FIG. 10, a method of training for a memory device of FIG. 10 may be substantially the same as the method of training for the memory device of FIG. 1, except that the method of training for the memory device of FIG. 10 further includes operations S500 and S600. Thus, redundant explanations will be omitted below.

After the initialization operation is performed on the memory device when the memory device is powered on (e.g., after operation S100), it may be determined whether the memory device is cold-booted in which the initialization operation is performed for the first time or the memory device is rebooted in which the initialization operation is not performed for the first time (operation S500). The operation where the memory device is cold-booted (e.g., a cold-booting operation) may represent a booting operation that is performed for the first time after the memory device or the computing system including the memory device is manufactured by a manufacturer and/or sold to a user. The operation where the memory device is rebooted (e.g., a rebooting or reset operation) may represent a booting operation that is performed after the cold-booting operation.

When the memory device is cold-booted (operation S500: YES), the training operation in operation S200, the operation of storing the training data in operation S300, and the operation of using the optimized operating parameter in operation S400 are performed.

When the memory device is not cold-booted, e.g., when the memory device is rebooted (operation S500: NO), the training data that was already obtained and stored in the host (e.g., the internal memory 70 of the host 50 in FIG. 2) may be loaded or restored (operation 600) because the memory device was already cold-booted, and the training operation in operation S200 and the operation of storing the training data in operation S300 were already performed.

When the memory device is rebooted (operation S500: NO), the operation of using the optimized operating parameter in operation S400 may not be performed based on the training data that is obtained by operation S300, but may be performed based on the training data that was already stored in the host and is loaded by operation S600. In other words, when the memory device is rebooted, the training operation in operation S200 and the operation of storing the training data in operation S300 may be omitted.

Referring to FIG. 11, a method of training for a memory device of FIG. 11 may be substantially the same as the method of training for the memory device of FIG. 10, except that the method of training for the memory device of FIG. 11 further includes operation S700. Thus, redundant explanations will be omitted below.

When the memory device is not cold-booted, e.g., when the memory device is rebooted (operation S500: NO), it may be determined whether the training data that was already obtained and stored in the host is normal or abnormal (operation S700) before the training data that was already obtained and stored in the host is loaded.

When the memory device is rebooted (operation S500: NO), and when the training data is normal (operation S700: YES), the training data that was already (i.e., previously) obtained and stored in the host may be loaded (operation S600). The operation of using the optimized operating parameter in operation S400 may be performed based on the training data that was already stored in the host and is loaded by operation S600. In other words, when the memory device is rebooted, the training operation in operation S200 and the operation of storing the training data in operation S300 may be omitted.

When the memory device is rebooted (operation S500: NO), and when the training data is abnormal (operation S700: NO), the training operation in operation S200 and the operation of storing the training data in operation S300 may be repeated because the training data may be (e.g., may be considered) damaged or broken due to, for example, some problems in the host (e.g., the internal memory 70 of the host 50 in FIG. 2) and/or attacks (e.g., hacking) from an outside to the host. In this case, the operation of using the optimized operating parameter in operation S400 may be performed based on the training data that is obtained by operations S200 and S300.

Referring to FIG. 12, a method of training for a memory device of FIG. 12 may be substantially the same as the method of training for the memory device of FIG. 10, except that the method of training for the memory device of FIG. 12 further includes operation S800. Thus, redundant explanations will be omitted below.

When the memory device is not cold-booted, e.g., when the memory device is rebooted (operation S500: NO), it may be determined whether a retention time of the training data is shorter than a reference time (operation S800) before the training data that was already obtained and stored in the host is loaded.

When the memory device is rebooted (operation S500: NO), and when the retention time of the training data is shorter than the reference time (operation S800: YES), the training data that was already obtained and stored in the host may be loaded (operation S600). The operation of using the optimized operating parameter in operation S400 may be performed based on the training data that was already (i.e., previously) stored in the host and is loaded by operation S600.

When the memory device is rebooted (operation S500: NO), and when the retention time of the training data is longer than or equal to the reference time (operation S800: NO), the training operation in operation S200 and the operation of storing the training data in operation S300 may be repeated because a reliability of the training data may be (e.g., may be considered) damaged or broken such that the training data in the host (e.g., the internal memory 70 of the host 50 in FIG. 2) is lost or a characteristic of the memory device is changed over time. In this case, the operation of using the optimized operating parameter in operation S400 may be performed based on the training data that is obtained by operations S200 and S300.

In one or more exemplary embodiments, operations S500 and S600 in FIGS. 10, 11 and 12, operation S700 in FIG. 11, and operation S800 in FIG. 12 may be performed by the host (e.g., the host 50 in FIG. 2). For example, operations S500, S600, S700, and S800 may be performed by a processor included in the host (e.g., the processor 60 included in the host 50 in FIG. 2).

In the method of training for the memory device according to an exemplary embodiment, the configurable operating parameters (e.g., the drive strengths, the ODT resistance values, etc.) for different operating frequencies of the memory device may be determined based on the training operation when the memory device is powered on. Thus, the optimized operating parameter may be efficiently determined and used based on the operating frequency and the operation mode. In addition, when the memory device is rebooted, the training data that was already obtained and stored in the host may be loaded. Thus, time for the booting operation (e.g., time required to perform the initialization operation) may be reduced. The operation of verifying the training data may be further performed before the training data that was already obtained and stored in the host is loaded.

One or more exemplary embodiments may be used or implemented in various devices and/or systems including the SOC and the memory device, such as a personal computer, a laptop computer, a mobile phone, a smart phone, a tablet computer, a personal digital assistants (PDA), an enterprise digital assistant (EDA), a portable multimedia player (PMP), a digital camera, a music player, a portable game console, a navigation device, a wearable device, an internet of things (IoT) device, an internet of everything (IoE) device, an e-book, a virtual reality (VR) device, an augmented reality (AR) device, a workstation, etc.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages of the present disclosure. Accordingly, all such modifications are intended to be included within the scope of the present disclosure as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A method of training for a memory device, the method comprising:
    performing an initialization operation on the memory device based on the memory device being powered on;
    performing a training operation on a plurality of operating frequencies of the memory device to obtain, as a configurable operating parameter for each of the plurality of operating frequencies, at least one of a plurality of operating parameters of the memory device;
    storing, as training data, the obtained configurable operating parameter for each of the plurality of operating frequencies; and
    using an optimized operating parameter for the memory device based on the training data, a current operation mode of the memory device, and a current operating frequency of the memory device.

2. The method of claim 1, wherein:
    the plurality of operating parameters comprises a plurality of drive strengths of the memory device; and
    the performing the training operation comprises:
        measuring a plurality of data valid windows of the memory device for the plurality of operating frequencies and for the plurality of drive strengths; and
        selecting at least one of the plurality of measured data valid windows based on a predetermined screen guide.

3. The method of claim 2, wherein measuring the plurality of data valid windows comprises:
    measuring first ranges of the plurality of data valid windows based on a data signal and a data strobe signal, each of the first ranges being along a first direction; and
    measuring second ranges of the plurality of data valid windows based on a reference voltage, each of the second ranges being along a second direction crossing the first direction.

4. The method of claim 3, wherein the measuring the first ranges of the plurality of data valid windows comprises fixing one of the data signal and the data strobe signal and shifting an other of the data signal and the data strobe signal.

5. The method of claim 3, wherein the measuring the second ranges of the plurality of data valid windows comprises shifting a level of the reference voltage.

6. The method of claim 2, wherein the storing the obtained configurable operating parameter for each of the plurality of operating frequencies comprises:
    storing, as the training data, a relationship between the plurality of operating frequencies and configurable drive strengths for the plurality of operating frequencies, based on the at least one selected data valid window.

7. The method of claim 6, wherein:
    the memory device includes a plurality of operation modes;
    the plurality of operation modes comprises a low power mode; and
    based on the current operation mode being the low power mode, a minimum drive strength among the configurable drive strengths is determined as the optimized operating parameter.

8. The method of claim 6, wherein:
    the memory device includes a plurality of operation modes;
    the plurality of operation modes comprises a high performance mode; and
    based on the current operation mode being the high performance mode, a maximum drive strength among the configurable drive strengths is determined as the optimized operating parameter.

9. The method of claim 1, wherein:
    the plurality of operating parameters comprises a plurality of on-die termination (ODT) resistance values of the memory device; and
    the performing the training operation comprises:
        measuring a plurality of data valid windows of the memory device for the plurality of operating frequencies and for the plurality of ODT resistance values, and selecting at least one of the plurality of measured data valid windows based on a predetermined screen guide.

10. The method of claim 1, wherein the plurality of operating parameters comprises a plurality of drive strengths of the memory device and a plurality of ODT resistance values of the memory device.

11. The method of claim 1, further comprising:
determining whether the memory device is cold-booted in which the initialization operation is performed for a first time or the memory device is rebooted in which the initialization operation is not performed for the first time; and
based on the memory device being determined to be rebooted, loading the training data that was previously obtained and stored,
wherein, based on the memory device being determined to be rebooted, the optimized operating parameter is used based on the training data that was previously obtained and stored.

12. The method of claim 11, wherein, based on the memory device being determined to be rebooted, the performing the training operation and the storing of the obtained configurable operating parameter for each of the plurality of operating frequencies are not performed.

13. The method of claim 11, further comprising:
based on the memory device being determined to be rebooted, determining whether the training data that was previously obtained and stored is normal,
wherein, based on the memory device being determined to be rebooted and the training data being determined to be normal, the optimized operating parameter is used based on the training data that was previously obtained and stored.

14. The method of claim 11, further comprising:
based on the memory device being rebooted, determining whether a retention time of the training data is shorter than a reference time,
wherein, based on the memory device being determined to be rebooted and the retention time of the training data being determined to be shorter than the reference time, the optimized operating parameter is used based on the training data that was previously obtained and stored.

15. A computing system comprising:
a memory device comprising a plurality of memory cells and configured to operate based on one of a plurality of operating frequencies; and
a host configured to:
perform an initialization operation on the memory device based on the memory device being powered on,
perform a training operation on the plurality of operating frequencies to obtain, as a configurable operating parameter for each of the plurality of operating frequencies, at least one of a plurality of operating parameters of the memory device,
store, as training data, the obtained configurable operating parameter for each of the plurality of operating frequencies, and
use an optimized operating parameter for the memory device based on the training data, a current operation mode of the memory device, and a current operating frequency of the memory device.

16. The computing system of claim 15, wherein:
the plurality of operating parameters comprises a plurality of drive strengths of the memory device; and
the host is further configured to perform the training operation by measuring a plurality of data valid windows of the memory device for the plurality of operating frequencies and for the plurality of drive strengths, and by selecting at least one of the plurality of measured data valid windows based on a predetermined screen guide.

17. The computing system of claim 16, wherein:
the host is further configured to provide a clock signal to the memory device;
first ranges of the plurality of data valid windows are measured, based on the clock signal, by fixing one of a data signal and a data strobe signal of the memory device and by shifting an other of the data signal and the data strobe signal; and
each of the first ranges is along a first direction.

18. The computing system of claim 17, further comprising:
a power supply device configured to provide a power supply voltage to the memory device,
wherein second ranges of the plurality of data valid windows are measured by shifting a level of a reference voltage that is generated based on the power supply voltage, and
wherein each of the second ranges is along a second direction crossing the first direction.

19. The computing system of claim 15, wherein:
the plurality of operating parameters comprises a plurality of on-die termination (ODT) resistance values of the memory device; and
the host is further configured to perform the training operation by measuring a plurality of data valid windows of the memory device for the plurality of operating frequencies and for the plurality of ODT resistance values, and by selecting at least one of the plurality of measured data valid windows based on a predetermined screen guide.

20. A system-on-chip (SOC) comprising:
one or more integrated circuits (ICs) configured to:
perform an initialization operation on an external memory device based on the external memory device being powered on,
perform a training operation on a plurality of operating frequencies of the external memory device to obtain, as a configurable operating parameter for each of the plurality of operating frequencies, at least one of a plurality of operating parameters of the external memory device,
store, as training data, the configurable operating parameter for each of the plurality of operating frequencies, and
use an optimized operating parameter for the external memory device based on the training data, a current operation mode of the external memory device, and a current operating frequency of the external memory device.

* * * * *

UNITED STATES PATENT AND TRADEMARK OFFICE
CERTIFICATE OF CORRECTION

PATENT NO.         : 10,559,335 B2
APPLICATION NO.    : 16/116369
DATED              : February 11, 2020
INVENTOR(S)        : Yong-Seob Kim and Jung-Il Lee Page 1 of 1

It is certified that error appears in the above-identified patent and that said Letters Patent is hereby corrected as shown below:

In the Claims

Column 18, Line 33, Claim 6, should read as follows:
6. The method of claim 2, wherein the storing the obtained configurable operating parameter for each of the plurality of operating frequencies comprises:
    storing, as the training data, a relationship between the plurality of operating frequencies and configurable drive strengths for the plurality of operating frequencies, based on the at least one selected measured data valid window.

Signed and Sealed this
Seventeenth Day of March, 2020

Andrei Iancu
*Director of the United States Patent and Trademark Office*